United States Patent [19]

Koriyama et al.

[11] Patent Number: 5,190,914
[45] Date of Patent: Mar. 2, 1993

[54] SUPERCONDUCTING MATERIAL OF METAL OXIDES

[75] Inventors: Shin-ichi Koriyama, Urayasu; Kazuhiro Sakuyama, Ichikawa; Toshihiko Maeda, Tokyo; Hisao Yamauchi, Urayasu; Shoji Tanaka, Tokyo, all of Japan

[73] Assignees: International Superconductivity Technology Center; Kyocera Corporation; Tohoku Electric Power Company, Inc.; Furukawa Electric Co., Ltd., all of Japan

[21] Appl. No.: 662,457

[22] Filed: Feb. 28, 1991

[30] Foreign Application Priority Data

Mar. 2, 1990 [JP] Japan .................................. 2-51483

[51] Int. Cl.⁵ ............................................. H01B 12/00
[52] U.S. Cl. ........................................ 505/1; 505/779; 505/780; 505/781; 501/152; 501/123; 252/518; 252/521
[58] Field of Search ...................... 505/779, 780, 781; 501/152, 123; 252/518, 521

[56] References Cited

PUBLICATIONS

Cava et al, "Superconductivity near 70K in a new family of layered copper oxides" Nature, vol. 336, pp. 211-214, Nov. 18, 1988.
PHYSICA C., vol. 166, No. 5 & 6, Apr. 1, 1990, pp. 413-416.
Japanese Journal of Applied Physics vol. 29, No. 7.
Journal of Materials Research, vol. 4, No. 4, pp. 763-766.
Veal et al, "Superconductivity in $YBa_{2-x}Sr_xCu_3O_{7-\delta}$", Preprint, Nov. 4, 1987.

Primary Examiner—William R. Dixon, Jr.
Assistant Examiner—C. M. Bonner
Attorney, Agent, or Firm—Lorusso & Loud

[57] ABSTRACT

A superconducting material is disclosed which includes oxides of metals having the following composition:

$$(Pb_{1-z}Cu_z)((Sr_{1-y}Ba_y)_{1-v}Ca_v)_2(A_{1-x}Ca_x)Cu_2$$

wherein A is at least one element selected from the group consisting of Y, La, Nd, Sm, Eu, Gd, Ho, Er, Yb and mixtures of at least one of Y, La, Nd, Sm, Eu, Gd, Ho, Er and Yb with at least one of Tb, Tm and Lu, x, y, v and z are numbers satisfying the following conditions:

$0 \leq x \leq 0.4$, $0.1 \leq y < 0.7$, $0 \leq v \leq 0.2x$, and $2y - 0.4 \leq z \leq 2y + 0.2$ with the proviso that $0.6 - x \leq z < 1.0$ when $0 \leq x \leq 0.2$ and that $0.4 \leq z < 1.0$ when $0.2 \leq x \leq 0.4$. The superconducting material is produced by providing a blend of compounds of the metals in the metal oxides, and heating the blend at an oxygen partial pressure P of at least 0.001 atm and temperature of $(860 + 40 \log P)$ °C. to $(1060 + 40 \log P)$ °C.

2 Claims, 1 Drawing Sheet

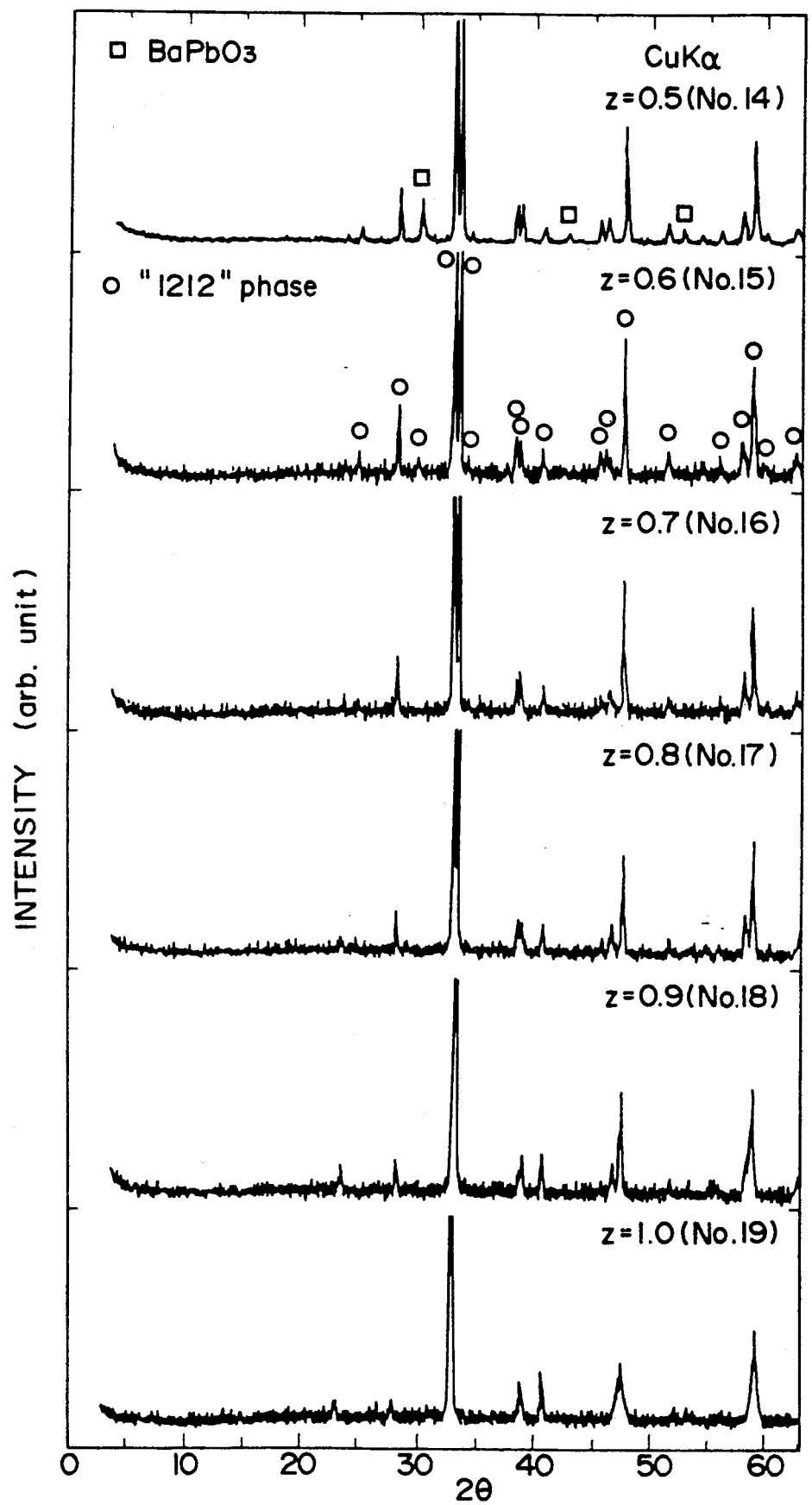

SUPERCONDUCTING MATERIAL OF METAL OXIDES

This invention relates generally to a novel superconducting material of metal oxides and, more specifically, to a superconducting material containing, as metal components, Pb, Sr, Ba, Y or a rare earth element, Ca and Cu. The present invention is also directed to a method of producing such a superconducting material.

As Pb-containing, copper oxide-type superconducting materials, $Pb_2Sr_2(Y, Ca)Cu_3O_w$ (hereinafter referred to as 2213-phase), $PbSrBa(Y, Ca)Cu_3O_w$ (hereinafter referred to as 1213-phase) and $(Pb, Sr)Sr_2(Y, Ca)Cu_2O_w$ (hereinafter referred to as 1212-phase) are known in the art (Cava, R. J. et al, Nature, 363, 211–214 (1988); Syono et al, Nikkei Chodendo, pp 4–5 (Jan. 1990); and Rouillon, T. et al, Physica C, 159, 201–209(1989)). The 2213- and 1213-phase superconducting materials which have a superconducting transition temperature Tc of about 50–70 K are considered to contain copper in both monovalent and divalent states. Thus, it is necessary to produce the 2213- and 1213 crystallographic phases in the atmosphere of a reducing gas so that both monovalent and divalent coppers may coexist. The 1212 phase superconducting material has a high Tc of about 100 K. The production of the 1212 crystallographic phase should be performed in a vacuum sealed quartz tube. Therefore, it is very difficult to practically utilize these materials for the production of superconducting articles such as a cable, since they require large, specific reaction apparatuses. It is reported that $(Pb, Cu)Sr_2YCu_2O_w$ which is a 1212 phase does not exhibit superconductivity (Sunshine, S. A. et al, Chemistry of Materials, 1, 331–335(1989)).

A $YBa_2Cu_3O_y$ (hereinafter referred to as 123-phase) superconductor which is the typical example of Pb-free copper oxide superconducting materials is known to have Tc of about 90 K. The 123 phase, however, has a problem because Tc thereof varies with the oxygen content thereof.

The present invention has been made with the foregoing problems of the known Pb-containing, metal oxide superconducting materials in view.

In accordance with one aspect of the present invention, there is provided a superconducting material comprising oxides of metals, said metals having the following composition:

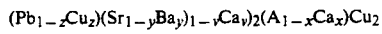

$(Pb_{1-z}Cu_z)(Sr_{1-y}Ba_y)_{1-v}Ca_v)_2(A_{1-x}Ca_x)Cu_2$ wherein A is at least one element selected from the group consisting of Y, La, Nd, Sm, Eu, Gd, Ho, Er, Yb and mixtures of at least one of Y, La, Nd, Sm, Eu, Gd, Ho, Er and Yb with at least one of Tb, Tm and Lu, x is a number not smaller than 0 but not greater than 0.4, v is a number not smaller than 0 but not greater than 0.2x, y is a number not smaller than 0.1 but is smaller than 0.7 and z is a number not smaller than (2y−0.4) but not greater than (2y+0.2) with the proviso that when x is smaller than 0.2 z is not smaller than (0.6−x) but smaller than 1.0 and when x is between 0.2 and 0.4 z is not smaller than 0.4 but is smaller than 1.0. In other words, x, y, v and z are numbers satisfying the following conditions:

$0 \leq x \leq 0.4$, $0.1 \leq y < 0.7$, $0 \leq v \leq 0.2x$, and $2y - 0.4 \leq z \leq 2y + 0.2$ with the proviso that $0.6 - x \leq z < 1.0$ when $0 \leq x \leq 0.2$ and that $0.4 \leq z < 1.0$ when $0.2 \leq x \leq 0.4$.

It is preferred that x, y, v and z be numbers satisfying the following conditions for reasons of providing a high Tc:

$0 \leq x \leq 0.4$;

$0.4 - 0.5x \leq y \leq 0.6$ and $0.7 - x \leq z < 1.0$ when $0 \leq x \leq 0.2$;

$0.3 \leq y \leq 0.6$ and $0.5 \leq z < 1.0$ when $0.2 \leq x \leq 0.4$; and $2y - 0.4 \leq z < 1.0$.

In another aspect, the present invention provides a method of producing the above superconducting material, comprising the steps of:

providing a blend of compounds of the metals in said metal oxides; and heating said blend at an oxygen partial pressure P of at least 0.001 atm and a temperature within the range of from $(860+40\log P)$ °C. to $(1060+40\log P)$ °C. where P is the oxygen partial pressure in terms of atm.

Preferably, the heating step is performed at an oxygen partial pressure P of 0.1 to 1 atm and a temperature within the range of from $(950+40\log P)$ °C. to $(1050+40\log P)$ °C.

Since the superconducting material according to the present invention can be produced in an oxidizing atmosphere, it is possible to obtain an elongated superconducting article such as a cable without using specific reaction conditions or apparatuses. Further, the superconducting material of this invention has a high Tc and has such a dense structure as to provide a high superconductive critical current density. Moreover, the superconducting material can be produced in various methods using gas phase, liquid phase or solid phase reactions. With a gas phase method, such as sputtering, vacuum evaporation or CVD, epitaxial growth is accelerated and the superconducting film as produced exhibits satisfactory characteristics. With a liquid phase method, such as coprecipitation, evaporation to dryness, sol-gel method or fusion quenching, too, the superconducting phase as produced exhibits satisfactory superconducting characteristics. When the superconducting material of this invention is processed to form a cable by wire drawing after being filled in a sheath, a post treatment for intentionally increasing the oxygen content may be omitted. In addition, the superconducting material of a Pb-system according to the present invention can be easily prepared at relatively low costs.

BRIEF DESCRIPTION OF THE DRAWINGS

The present invention will now be described in detail below with reference to the accompanying drawings in which the sole FIGURE is X-ray diffraction patterns of Sample Nos. 14–19 obtained in Example 1.

DETAILED DESCRIPTION OF THE INVENTION

The superconducting material according to the present invention has a crystallographic phase which is similar to that of known (Pb, Cu)Sr$_2$YCu$_2$O$_w$ but which differs from the known 1212 phase in that portions of Sr and Y are substituted with Ba and Ca, respectively, in the superconducting material of the present invention. In the superconducting material of this invention the amount and disposition of oxygen are not critical. Generally, w is a number in the range of between 6.9 and 7.0.

It has been found that when the known 1212 phase is prepared in an oxidizing atmosphere, superconductivity is not observed. The X-ray diffraction analysis has revealed that when (Pb, Sr)Sr$_2$(Y, Ca)Cu$_2$O$_w$ is prepared in an oxidizing atmosphere Sr does not exist in the same site with that of Pb and that when (Pb, Cu)Sr$_2$(Y, Ca)Cu$_2$O$_w$ is prepared in an oxidizing atmosphere Ca is not completely dissolved into the Y site with a Pb/Cu ratio of 1:1. This fact, when taken in conjunction with the fact that the known, superconducting 1212 phase is prepared in a vacuum sealed reactor, suggests that the vacuum sealing is essential for the production of the known (Pb, Cu)Sr$_2$(Y, Ca)Cu$_2$O$_w$ superconducting material.

In contrast, the (Pb, Cu)(Sr, Ba, Ca)$_2$(A, Ca)Cu$_2$O$_w$ superconducting material of this invention can be produced by a heat treatment in an oxidizing atmosphere. The X-ray diffraction analysis has revealed that the presence of Ba permits Ca to form solid solution. The superconductivity in the material of this invention is considered to be ascribed to the sufficient dissolution of divalent Ca ion into trivalent A ion (Y or a rare earth element), which results in the introduction of a sufficient amount of holes to show superconductivity.

It is considered that the Ba substitution can form an ion disposition in the vicinity of A ion (Y or a rare earth element) similar to that of YBa$_2$CuO$_3$O$_w$ (Jirak, Z. et al, Physica C 156, 750-754(1988)) so that Ca can be dissolved into the Y site.

The superconducting material of the present invention may be produced by a method including providing a blend of compounds of the metals in the metal oxide superconducting material. The blend is in the form of a solid and may be obtained by a method including mixing powders of metal compounds, a method including applying a solution containing the metal compounds onto a substrate, followed by drying or a method including subjecting a solution containing the metal compounds to coprecipitation conditions. Other methods such as spattering, vacuum evaporation, CVD, fusion quenching or sol-gel may be also used. The solid blend is then heated at an oxygen partial pressure P of at least 0.001 atm and a temperature of between (860+40logP) ° C. and (1060+40logP) ° C. where P is the oxygen partial pressure in terms of atm.

The following examples will further illustrate the present invention.

EXAMPLE 1

Powders of PbO, SrCO$_3$, BaCO$_3$, Y$_2$O$_3$, CaCO$_3$ and CuO were mixed in molar proportions so that blends having the following chemical compositions were obtained:

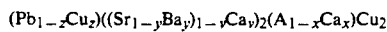

$(Pb_{1-z}Cu_z)((Sr_{1-y}Ba_y)_{1-v}Ca_v)_2(A_{1-x}Ca_x)Cu_2$ in which x, y, v and z are numbers as shown in Table 1. Each of the blends was pressure molded to form a parallelepiped bar and the bar was sintered at 1000° C. for 1 hour in an oxygen stream at 1 atmosphere. The resulting products were tested for their X-ray diffraction patterns and superconductivity and the results were as summarized in Table 1. In Table 1, $T_{ON}$ is a temperature (K) at which the resistivity abruptly begins decreasing and $T_{R=0}$ is a temperature (K) at which the resistivity becomes 0. In Table 1, the term "1212 phase" refers to the crystallographic phase similar to that of the known (Pb, Sr)Sr$_2$(Y, Ca)Cu$_2$O$_w$ superconducting material. Samples Nos. 1, 3, 4, 8, 9, 14, 19, 20, 23, 29, 30, 32, 38, 39, 41 and 44 are comparative samples.

From these results, it is seen that when Ba is not present (y=0), no superconductivity is exhibited. Superconductivity is observed when Ba is present. With the increase in Ba content, Tc becomes higher but an impurity phase (BaPbO$_3$) is formed. This impurity phase disappears, without encountering a reduction of Tc, when the amount of Cu is increased (when z is increased). Even with a high Cu content, however, the impurity phase occurs when y is increased to 0.7. When x is 0 and y is 0.5, Tc increases with the increase in Pb content (with the decrease in z). This suggests that even a small amount of Pb serves to reduce non-stoichiometry of oxygen to the extent that no specific post treatment is necessitated.

EXAMPLE 2

Powders of PbO, SrCO$_3$, BaCO$_3$, A$_2$O$_3$ (or A$_6$O$_{11}$ or AO$_2$), CaCO$_3$ and CuO were mixed in molar proportions so that blends having the following chemical compositions were obtained:

$(Pb_{1-z}Cu_z)(Sr_{1-y}Ba_y)_2(A_{1-x}Ca_x)Cu_2$ in which x, y and z are 0.4, 0.5 and 0.7, respectively. As the element A, Y and the rare earth elements as shown in Table 2 were used. Each of the blends was pressure molded to form a bar and the bar was sintered at 1000° C. for 1 hour in an oxygen stream at 1 atmosphere. The resulting products were tested for their X-ray diffraction patterns and superconductivity and the results were summarized in Table 2. From the results shown in Table 2, it is seen that the use of Ce or Pr which is generally tetravalent fails to produce superconductivity. Except for La, Tc is increased with the decrease of the ion radius. This also applies to the case in which two or more elements are used in combination, when the average ion radius of the combined elements is taken into account.

EXAMPLE 3

Powders of PbO, SrCO$_3$, BaCO$_3$, Y$_2$O$_3$, CaCO$_3$ and CuO were mixed in molar proportions so that a blend having the following chemical compositions was obtained:

$(Pb_{1-z}Cu_z)(Sr_{1-y}Ba_y)_2(Y_{1-x}Ca_x)Cu_2$ in which x, y and z are 0.4, 0.5 and 0.7, respectively. Portions of the blend were pressure molded to form bars and the bars were sintered at a temperature and under a partial pressure of oxygen as shown in Table 3. The resulting products were tested for their X-ray diffraction patterns and superconductivity and the results were as summarized in Table 3. From the results shown in Table 3, it will be noted that an oxygen partial pressure of at least 0.001 atm is necessary to obtain the 1212 phase. When the oxygen partial pressure is lower than 0.001, there is formed 2213 phase. Further, it is seen that Sample Nos. 69, 70, 73, 74 and 77 which were produced at a temperature outside of the (860+40logP) ° C. to (1060+40 logP) ° C. range do not exhibit superconductivity.

EXAMPLE 4

Powders of PbO, SrCO$_3$, BaCO$_3$, Y$_2$O$_3$, CaCO$_3$ and CuO were mixed in molar proportions so that a blend having the following chemical compositions was obtained:

$(Pb_{1-z}Cu_z)(Sr_{1-y}Ba_y)_2(Y_{1-x}Ca_x)Cu_2$ in which x, y and z are 0.4, 0.5 and 0.7, respectively. Portions of the blend were subjected to thermal analysis. Other portions of the blend were pressure molded and sintered at a temperature and under a partial pressure of oxygen as shown in Table 4. The resulting products were subjected to porosity measurement and superconducting critical current density measurement to obtain the results summarized in Table 4. From the results shown in Table 4, it will be understood that the superconducting critical current density of samples obtained by using a heat treatment temperature higher than the just-below temperature of the heat absorption peak is higher than that obtained at heat treatment temperature lower than the just-below temperature. The just-below temperature is a temperature at which part of the components of the sample is fused. The above fact, when considered in the light of the porosity values, suggests that the heat treatment at a temperature causing partial fusion of the components of the sample can make the sample more dense so that the effective cross-sectional area in which the electrical current flows is increased.

EXAMPLE 5

Powders of PbO, SrCO$_3$, BaCO$_3$, Y$_2$O$_3$, CaCO$_3$ and CuO were mixed in molar proportions so that a blend having the following chemical compositions was obtained:

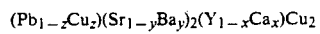
$(Pb_{1-z}Cu_z)(Sr_{1-y}Ba_y)_2(Y_{1-x}Ca_x)Cu_2$ in which x, y and z are 0.4, 0.1 and 0.7, respectively. Portions of the blend were pressure molded and sintered at 1000 ° C. in an oxygen stream. The resulting products were then post-treated under various conditions as shown in Table 5 to obtain products whose Tc were as shown in Table 5. From the results summarized in Table 5, it is seen that the post treatment at a high oxygen partial pressure can produce superconducting materials with a high Tc. Such a post treatment, though it is not essential in the present invention, can improve T$_{ON}$.

TABLE 1

| Sample No. | v | x | y | z | Crystal Phase | T$_{ON}$ | T$_{R=0}$ |
|---|---|---|---|---|---|---|---|
| 1** | 0 | 0 | 0.2 | 0.5 | (1212) | — | — |
| 2 | 0 | 0 | 0.2 | 0.6 | (1212) | 12 | — |
| 3** | 0 | 0 | 0.2 | 0.7 | (1212) + SrCuO$_2$ | 11* | — |
| 4** | 0 | 0 | 0.3 | 0.5 | (1212) | — | — |
| 5 | 0 | 0 | 0.3 | 0.6 | (1212) | 19 | — |
| 6 | 0 | 0 | 0.3 | 0.7 | (1212) | 22 | 12 |

TABLE 1-continued

| Sample No. | v | x | y | z | Crystal Phase | T$_{ON}$ | T$_{R=0}$ |
|---|---|---|---|---|---|---|---|
| 7 | 0 | 0 | 0.3 | 0.8 | (1212) | 30 | 19 |
| 8** | 0 | 0 | 0.3 | 0.9 | (1212) + SrCuO$_2$ | 32* | 12* |
| 9** | 0 | 0 | 0.4 | 0.5 | (1212) | — | — |
| 10 | 0 | 0 | 0.4 | 0.6 | (1212) | 25 | 12 |
| 11 | 0 | 0 | 0.4 | 0.7 | (1212) | 40 | 27 |
| 12 | 0 | 0 | 0.4 | 0.8 | (1212) | 46 | 37 |
| 13 | 0 | 0 | 0.4 | 0.9 | (1212) | 54 | 39 |
| 14** | 0 | 0 | 0.5 | 0.5 | (1212) | — | — |
| 15 | 0 | 0 | 0.5 | 0.6 | (1212) | 32 | 20 |
| 16 | 0 | 0 | 0.5 | 0.7 | (1212) | 57 | 42 |
| 17 | 0 | 0 | 0.5 | 0.8 | (1212) | 76 | 68 |
| 18 | 0 | 0 | 0.5 | 0.9 | (1212) | 74 | 67 |
| 19** | 0 | 0 | 0.5 | 1.0 | (1212) | 72 | 58 |
| 20** | 0 | 0 | 0.6 | 0.7 | (1212) + BaPbO$_3$ | 60* | 37* |
| 21 | 0 | 0 | 0.6 | 0.8 | (1212) | 77 | 68 |
| 22 | 0 | 0 | 0.6 | 0.9 | (1212) | 75 | 65 |
| 23** | 0 | 0 | 0.7 | 0.9 | (1212) + BaPbO$_3$ | 75* | 58* |
| 24 | 0 | 0.2 | 0.2 | 0.4 | (1212) | 33 | 18 |
| 25 | 0 | 0.2 | 0.2 | 0.6 | (1212) | 46 | 29 |
| 26 | 0 | 0.2 | 0.4 | 0.4 | (1212) | 48 | 35 |
| 27 | 0 | 0.2 | 0.4 | 0.6 | (1212) | 58 | 48 |
| 28 | 0 | 0.2 | 0.4 | 0.8 | (1212) | 72 | 59 |
| 29** | 0 | 0.2 | 0.4 | 1.0 | (1212) | 70 | 58 |
| 30** | 0 | 0.2 | 0.6 | 0.6 | (1212) + BaPbO$_3$ | 45* | 29* |
| 31 | 0 | 0.2 | 0.6 | 0.8 | (1212) | 80 | 71 |
| 32** | 0 | 0.2 | 0.6 | 1.0 | (1212) | 77 | 66 |
| 33 | 0 | 0.4 | 0.2 | 0.4 | (1212) | 28 | 10 |
| 34 | 0 | 0.4 | 0.2 | 0.6 | (1212) | 46 | 21 |
| 35 | 0 | 0.4 | 0.4 | 0.4 | (1212) | 35 | 19 |
| 36 | 0 | 0.4 | 0.4 | 0.6 | (1212) | 70 | 53 |
| 37 | 0 | 0.4 | 0.4 | 0.8 | (1212) | 83 | 72 |
| 38** | 0 | 0.4 | 0.4 | 1.0 | (1212) | 77 | 62 |
| 39** | 0 | 0.4 | 0.6 | 0.6 | (1212) + BaPbO$_3$ | 80* | 45* |
| 40 | 0 | 0.4 | 0.6 | 0.8 | (1212) | 83 | 74 |
| 41** | 0 | 0.4 | 0.6 | 1.0 | (1212) | 75 | 65 |
| 42 | 0.4 | 0.4 | 0.4 | 0.6 | (1212) | 73 | 60 |
| 43 | 0.8 | 0.4 | 0.4 | 0.6 | (1212) | 74 | 63 |
| 44** | 0.12 | 0.4 | 0.4 | 0.6 | (1212) + (Sr,Ca)CuO$_2$ | 68* | 58* |

*: Tc of (1212) phase only (analyzed by the EDX method)
**: comparative sample

TABLE 2

| Sample No. | Element A | Crystal Phase | T$_{ON}$ | T$_{R=0}$ |
|---|---|---|---|---|
| 45 | La | (1212) | 61 | 39 |
| 46** | Ce | unconfirmed phase | — | — |
| 47** | Pr | unconfirmed phase | — | — |
| 48 | Nd | (1212) | 53 | 30 |
| 49 | Sm | (1212) | 54 | 32 |
| 50 | Eu | (1212) | 56 | 36 |
| 51 | Gd | (1212) | 70 | 46 |
| 52 | Dy | (1212) | 77 | 56 |
| 53 | Ho | (1212) | 77 | 60 |
| 54 | Er | (1212) | 80 | 50 |
| 55 | Yb | (1212) | 78 | 55 |
| 56 | Y$_{0.5}$Ce$_{0.5}$ | (1212) + Unconfirmed | 58 | 22 |
| 57 | Y$_{0.5}$Pr$_{0.5}$ | (1212) + Unconfirmed | 44 | 22 |
| 58 | Y$_{0.5}$Eu$_{0.5}$ | (1212) | 60 | 21 |
| 59 | Y$_{0.5}$Ho$_{0.5}$ | (1212) | 81 | 42 |
| 60 | Y$_{0.5}$Yb$_{0.5}$ | (1212) | 80 | 62 |
| 61 | La$_{0.5}$Eu$_{0.5}$ | (1212) | 47 | 67 |
| 62 | La$_{0.5}$Ho$_{0.5}$ | (1212) | 52 | 19 |
| 63 | La$_{0.5}$Yb$_{0.5}$ | (1212) | 55 | 36 |

**: comparative sample

TABLE 3

| Sample No. | Oxygen Partial Pressure (atm) | Temperature (°C.) | Crystal Phase | T$_{ON}$ | T$_{R=0}$ |
|---|---|---|---|---|---|
| 64** | 0.0001 | 800 | (2213) + Impurity | — | — |
| 65** | 0.0001 | 840 | (2213) + Impurity | — | — |
| 66** | 0.0001 | 880 | Melted | — | — |
| 67 | 0.001 | 800 | (1212) | 56 | 31 |
| 68 | 0.001 | 880 | (1212) | 60 | 38 |

TABLE 3-continued

| Sample No. | Oxygen Partial Pressure (atm) | Temperature (°C.) | Crystal Phase | $T_{ON}$ | $T_{R=0}$ |
|---|---|---|---|---|---|
| 69** | 0.001 | 960 | Melted | — | — |
| 70** | 0.1 | 800 | Impurity | — | — |
| 71 | 0.1 | 880 | (1212) | 65 | 44 |
| 72 | 0.1 | 960 | (1212) | 70 | 57 |
| 73** | 0.1 | 1040 | Melted | — | — |
| 74** | 10 | 880 | Impurity | — | — |
| 75 | 10 | 960 | (1212) | 72 | 60 |
| 76 | 10 | 1040 | (1212) | 83 | 75 |
| 77** | 10 | 1120 | Melted | — | — |

**: comparative samples

TABLE 4

| Sample No. | Heat Treatment | | Heat Absorption Peak Temperature | | Porosity (%) | Critical Current Density (A/cm$^2$) |
|---|---|---|---|---|---|---|
| | Oxygen Partial Pressure (atm) | Temperature (°C.) | Just Below (°C.) | Melting Point (°C.) | | |
| 78 | 0.1 | * | 967 | 985 | — | — |
| 79** | 0.1 | 940 | — | — | 17 | 130 |
| 80** | 0.1 | 960 | — | — | 16 | 260 |
| 81 | 0.1 | 970 | — | — | 8 | 1600 |
| 82 | 0.1 | 980 | — | — | 5 | 2020 |
| 83 | 10 | * | 1021 | 1044 | — | — |
| 84** | 10 | 960 | — | — | 20 | 210 |
| 85** | 10 | 980 | — | — | 18 | 380 |
| 86** | 10 | 1000 | — | — | 17 | 390 |
| 87 | 10 | 1020 | — | — | 8 | 1070 |
| 88 | 10 | 1030 | — | — | 3 | 2550 |
| 89 | 10 | 1040 | — | — | 3 | 2990 |

*: thermoanalysis
**: comparative sample

TABLE 5

| Sample No. | Post Treatment | | | $T_{ON}$ | $T_{R=0}$ |
|---|---|---|---|---|---|
| | Oxygen partial Pressure (atm) | Temperature (°C.) | Time (hour) | | |
| 90 | 0.1 | 500 | 5 | 81 | 68 |
| 91 | 0.1 | 500 | 50 | 83 | 74 |
| 92 | 1 | 500 | 5 | 83 | 72 |
| 93 | 10 | 500 | 5 | 84 | 74 |
| 94 | 400 | 500 | 5 | 83 | 75 |
| 95 | 400 | 900 | 5 | 83 | 76 |

What is claimed is:

1. A superconducting material comprising metal oxides wherein the metals in said metal oxides are defined by the following formula:

$$(Pb_{1-z}Cu_z)((Sr_{1-y}Ba_y)_{1-v}Ca_v)_2(A_{1-x}Ca_x)Cu_2$$

wherein A is at least one element selected from the group consisting of Y, La, Nd, Sm, Eu, Gd, Ho, Er, Yb and mixtures of at least one of Y, La, Nd, Sm, Eu, Gd, Ho, Er and Yb with a least one of Tb, Tm and Lu, x is a number not smaller than 0 but not greater than 0.4, v is a number not smaller than 0 but not greater than 0.2x, y is a number not smaller than 0.1 but is less than or equal to 0.6 and z is a number not smaller than (2y−0.4) but not greater than (2y+0.2) with the proviso that when x is smaller than 0.2, z is not smaller than (0.6−x) but smaller than 1.0 and when x is between 0.2 and 0.4, z is not smaller than 0.4 but is smaller than 1.0.

2. A superconducting material as claimed in claim 1, wherein x, y, v and z are numbers satisfying the following conditions:

$0 \leq x \leq 0.4$;

$0.4 - 0.5x \leq y \leq 0.6$ and $0.7 - x \leq z < 1.0$ when $0 \leq x \leq 0.2$;

$0.3 \leq y \leq 0.6$ and $0.5 \leq z < 1.0$ when $0.2 \leq x \leq 0.4$; and $2y - 0.4 \leq z < 1.0$.

* * * * *

UNITED STATES PATENT AND TRADEMARK OFFICE
CERTIFICATE OF CORRECTION

PATENT NO. : 5,190,914

DATED : March 2, 1993

INVENTOR(S) : KORIYAMA et al

It is certified that error appears in the above-identified patent and that said Letters Patent is hereby corrected as shown below:

Column 5, line 49, delete "0.t" and insert --0.5--.

Signed and Sealed this

Fourth Day of January, 1994

Attest:

BRUCE LEHMAN

Attesting Officer     Commissioner of Patents and Trademarks